United States Patent [19]

Ozawa et al.

[11] Patent Number: 4,540,951
[45] Date of Patent: Sep. 10, 1985

[54] AMPLIFIER CIRCUIT

[75] Inventors: Akio Ozawa; Susumu Sueyoshi; Keishi Sato; Kikuo Ishikawa; Kiyomi Yatsuhashi; Satoshi Ishii; Masamichi Yumino, all of Tokyo, Japan

[73] Assignee: Pioneer Electronic Corporation, Tokyo, Japan

[21] Appl. No.: 523,258

[22] Filed: Oct. 27, 1983

Related U.S. Application Data

[62] Division of Ser. No. 188,792, Sep. 19, 1980, Pat. No. 4,433,305.

[30] Foreign Application Priority Data

Sep. 21, 1979 [JP] Japan .................. 54-121646
Sep. 21, 1979 [JP] Japan .................. 54-121649

[51] Int. Cl.³ .................................. H03F 3/26
[52] U.S. Cl. ................. 330/267; 330/296; 330/288
[58] Field of Search ............ 330/262, 263, 267, 274, 330/296, 288

[56] References Cited

U.S. PATENT DOCUMENTS 4,103,248 7/1978 Idei ........................ 330/288

Primary Examiner—James B. Mullins
Assistant Examiner—G. Wan
Attorney, Agent, or Firm—Sughrue, Mion, Zinn, Macpeak, and Seas

[57] ABSTRACT

A push-pull amplifier circuit using bipolar transistors in which non-linear distortion caused by the base-emitter voltages of the amplifying transistors of the circuit is eliminated without the use of negative AC feedback and in which variations in a DC output level at the output terminal of the amplifier are detected and fed back to the input side of the amplifier whereby the stability of the circuit at very low frequencies is remarkably improved. A first amplifier stage includes a first transistor having a base to which an input signal is applied and a second transistor the base of which is coupled to an output of the first transistor with the second transistor being of the opposite conductivity type of the first transistor. A current mirror circuit supplies currents to the first and second transistors with the currents thus supplied having a constant ratio. A second amplifying stage is provided having the same construction. A load is coupled to be driven by the current flowing through the first transistor in the first amplifying stage and by the corresponding transistor in the second amplifying stage. Variations in the output of the circuit are detected to provide a DC feedback voltage which is coupled back to emitter circuits in the input stages of the amplifier.

10 Claims, 5 Drawing Figures

AMPLIFIER CIRCUIT

This a division of application Ser. No. 188,792 filed Sept. 19, 1980, now U.S. Pat. No. 4,433,305.

BACKGROUND OF THE INVENTION

The present invention relates to an amplifier circuit. More particularly, the invention relates to push-pull amplifiers using bipolar transistors.

It is necessary in an amplifier to minimize distortion in the output therefrom. A large variety of distortion reducing techniques have been proposed. According to one well-known technique, distortion is reduced by the use of AC negative feedback. In this case, however, the amplification factor is unavoidably reduced. Therefore, in order to obtain a desired amplification factor, an increased number of amplifying elements or stages is required. Further, the stability of the overall amplifier circuit is reduced with the use of this technique.

More specifically, transistors commonly used as amplifying elements have somewhat non-linear input/output characteristics. In view of this disadvantage, it has been proposed to employ a large amount of AC negative feedback. However, the use of a large amount of negative feedback does not adequately compensate for the non-linearities.

Further, in ordinary push-pull amplifiers using bipolar transistors, generally, two voltage sources, one positive and the other negative, are used. Accordingly, it is necessary to always maintain the potential level at the output terminal of the amplifier at a neutral level between the positive level and the negative level, that is, at ground level.

If a DC voltage were present at the output terminal, a DC current could flow through the load, such as a loudspeaker connected to the output terminal, resulting in damage to the loudspeaker.

SUMMARY OF THE INVENTION

Accordingly, a primary object of the present invention is to eliminate the above-described drawbacks accompanying the conventional amplifier circuits.

More specifically, an object of the invention is to provide a push-pull type transistor amplifier circuit in which non-linear distortion caused by the transistors thereof is eliminated without the use of AC negative feedback. Another object of the invention is to provide a transistor amplifier circuit in which variations in the DC output potential level at the output terminal thereof are detected and used to form DC feedback to the input side of the amplifier circuit whereby the stability of the circuit at very low frequencies is remarkably improved.

These, as well as other objects of the invention, are met by a push-pull amplifier circuit including first and second amplifying means or stages. The first amplifying means includes a first transistor having a base to which an input signal is applied and a second transistor having a base to which an output of the first transistor is applied. The second transistor is opposite in conductivity type to the first transistor. Means is provided, such as a current mirror circuit, for supplying currents to the first and second transistors with the ratio of the currents supplied to the first and second transistors being maintained constant. Similarly, the second amplifying means includes a third transistor having a base to which an input signal is applied, which may be the same input signal applied to the base of the first transistor, and a fourth transistor having a base to which an output of the third transistor is applied. The fourth transistor is of the opposite conductivity type to the third transistor. Means is provided for supplying currents to the third and fourth transistors with the ratio of the currents supplied to the third and fourth transistors being constant. A load is coupled to be driven by the current flowing through the first and second transistors and by the current flowing through the second and fourth transistors. The first and third transistors may be connected in emitter follower configurations with the emitter follower outputs thereof applied to the bases of the second and fourth transistors.

Yet further, the objects of the invention are met by an amplifier circuit including a first transistor having a base to which an input signal is applied, a second transistor having a base to which the output of the first transistor is applied with the second transistor being opposite in conductivity type to the first transistor. Means is provided for supplying currents to the first and second transistors with those currents having a constant ratio. Means is provided for forming an output corresponding to variations in the currents flowing through the first and second transistors as well as means for detecting variations of the output of the output providing means to provide a feedback voltage corresponding to the variations to a predetermined circuit point. The output of the detecting means may, for example, be fed back to the emitter side of the second transistor. The first transistor may be connected in an emitter follower configuration with the emitter follower output of the first transistor applied to the base of the second transistor. The first transistor is preferably opposite in conductivity type to the third transistor.

In any of these embodiments, the push-pull amplifier circuit can further include means for providing an output corresponding to the current flowing through one of the first and second transistors and corresponding to the current flowing through one of the third and fourth transistors to thereby drive the load. Means is then provided for detecting variations in the output of the output providing means to thereby provide a feedback voltage corresponding to the variations which is coupled to a predetermined circuit point. The output of the detecting means is preferably fed back to the emitters of the second and fourth transistors. The first and third transistors in that case are connected in emitter follower configurations with the emitter followers outputs thereof applied to the bases of the second and fourth transistors, respectively.

DESCRIPTION OF THE PREFERRED EMBODIMENTS

The present invention will be described in detail hereinafter with reference to the accompanying drawings.

Figure 1:
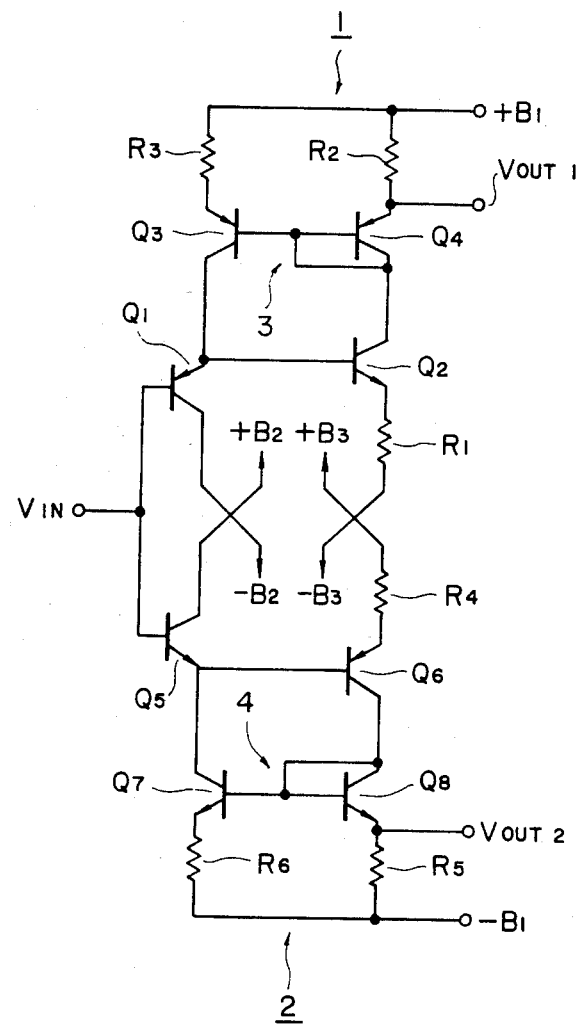
FIG. 1 is a circuit diagram for the purpose of describing the principle of the present invention.

FIG. 1 is a circuit diagram for the purpose of describing the principle of the invention. In FIG. 1, an amplifier circuit according to the invention includes a first amplifier stage 1 and a second amplifier stage 2 which are coupled complementarily. The first amplifier stage 1 includes an emitter follower PNP transistor $Q_1$, the emitter output of which is applied to the base of an NPN transistor $Q_2$ as a base input. The emitter of the transistor $Q_2$ is connected through an emitter resistor $R_1$ to a negative voltage source $-B_3$. The collector of the input transistor $Q_1$ is directly connected to a negative voltage source $-B_2$. A current source 3 such as a current mirror circuit is provided to supply currents $I_1$ and $I_2$ having a constant ratio to the transistors $Q_1$ and $Q_2$, respectively.

The current mirror circuit 3 is composed of emitter resistors $R_2$ and $R_3$ and PNP transistors $Q_3$ and $Q_4$ whose bases are connected commonly, as shown in FIG. 1. The transistor $Q_4$ is connected in a diode configuration. By properly selecting resistance values of the resistors $R_2$ and $R_3$, the ratio $I_1/I_2$ of currents respectively supplied to the transistors $Q_1$ and $Q_2$ is set to a desired value $1/\alpha$ where $\alpha$ is a constant. In the embodiment shown in FIG. 1 the voltage developed across the emitter resistor $R_2$ of the transistor $Q_4$ is used as an output signal $V_{OUT1}$.

The second amplifier stage 2 which is coupled complementarily to the first amplifier stage 1, includes transistors $Q_5$ through $Q_8$ corresponding to the above transistors $Q_1$ through $Q_4$ as complementary elements. The arrangement of the circuit elements in the second amplifier stage 2 is identical to that of the first amplifier stage 1. The transistors $Q_7$ and $Q_8$ constitute a current mirror circuit 4 as a current supply circuit together with emitter resistors $R_5$ and $R_6$. The ratio of currents $I_3$ and $I_4$ supplied to the transistors $Q_5$ and $Q_6$, respectively, is made constant as described above.

The operation of the above described circuit construction will be described in detail with reference primarily to the first amplifier stage 1 only as the operation of the two stages is basically the same. With the base-emitter voltages of the transistors $Q_1$ and $Q_2$ represented by $V_{BE1}$ and $V_{BE2}$, the following expression is established:

$$I_2 = (V_{IN} + V_{BE1} - V_{BE2} + B_3)/R_1. \quad (1)$$

Generally, the relationship between the collector current $I_C$ of a transistor and the base-emitter voltage $V_{BE}$ thereof is expressed as follows:

$$V_{BE} = \frac{kT}{q} \ln\left(\frac{I_C}{I_S} + 1\right), \quad (2)$$

where q is the electron charge, k is Boltzmann's constant, T the absolute temperature and $I_S$ the base-emitter reverse saturation current. Accordingly, $(V_{BE1} - V_{BE2})$ in equation (1) can be expressed as follows:

$$V_{BE1} - V_{BE2} = \quad (3)$$

-continued
$$\frac{k}{q}\left\{ T_1 \ln\left(\frac{I_1}{I_{S1}} + 1\right) - T_2 \ln\left(\frac{\alpha I_1}{I_{S2}} + 1\right)\right\},$$

where $\alpha = I_2/I_1$, is the temperature at the junction between the base and emitter of the transistor $Q_1$ and $T_2$ is the temperature at the junction between the base and emitter of the transistor $Q_2$. Since $I_S$ is a fixed value for each transistor, $I_{S2}$ can be replaced by $\beta I_{S1}$ where $\beta$ is a constant. Further, $I_S$ is extremely small. If a sufficiently large collector current flows through the transistor, $I_C/I_S$ is much greater than 1. Therefore, the following expression can be established:

$$V_{BE1} - V_{BE2} \approx \frac{k}{q}\left( T_1 \ln\left(\frac{I_1}{I_{S1}}\right) - T_2 \ln\left(\frac{\alpha I_1}{\beta I_{S1}}\right)\right). \quad (4)$$

In equation (4), assuming that the junction temperature is constant:

$$V_{BE1} - V_{BE2} = \frac{kT}{q} \ln(\beta/\alpha). \quad (5)$$

Consequently, the right side of equation (5) can be regarded as a constant. Representing the constant value by $\gamma$, equation (1) is rewritten as follows:

$$I_2 = (V_{IN} + B_3 + \gamma)/R_1. \quad (6)$$

As a result, the output $V_{OUT1}$ can be expressed as follows:

$$V_{OUT1} = I_2 R_2 = \frac{R_2}{R_1}(V_{IN} + B_3 + \gamma). \quad (7)$$

Similarly, in the second amplifier stage 2, the following expression is established:

$$V_{OUT2} = \frac{R_5}{R_4}(V_{IN} + B_3 + \gamma). \quad (8)$$

If the respective resistance values of the resistors $R_1$, $R_2$, $R_4$ and $R_5$ are determined such that $R_1 = R_4$ and $R_2 = R_5$, and the output $V_{OUT1}$ and $V_{OUT2}$ are suitably combined to drive a load in a push-pull manner, the gain of the overall push-pull amplifier circuit is twice the gain in each amplifier stage defined by $R_2/R_1 = R_5/R_4$. Furthermore, the final output is completely independent of the base-emitter voltage $V_{BE}$. Thus, distortion in the output is greatly suppressed. In addition, as is well known in the art, because of the push-pull arrangement, distortion caused by the presence of even numbered higher harmonics is reduced. This results in a great improvement in decreasing the distortion in the output signal. That is, although in each amplifier, as indicated by equations (7) and (8), the outputs $V_{OUT1}$ and $V_{OUT2}$ are independent of the base-emitter voltages $V_{BE}$, practically, in view of the fact that the transistors have characteristics different from each other, the base currents flowing therethrough are also different from each other and thus complete suppression of distortion is not accomplished in each stage. However, according to the invention, since the circuit employs a push-pull arrangement, complete distortion suppression is provided.

In order to obtain an output signal, the variations in currents flowing through the transistors $Q_2$ and $Q_6$ are used to form the output. However, the way in which the output signal is provided is not particularly limited to that shown in FIG. 1. More specifically, resistors may be provided between the collector of the transistor $Q_2$ and the current source 3 and between the collector of the transistor $Q_6$ and the current source 4, respectively, and the voltages appearing across the resistor used as an output. Furthermore, in the case where an amplified output is not required, the output appearing across either emitter resistor $R_1$ or $R_4$ may be used. Moreover, since the currents flowing through the transistors $Q_2$ and $Q_6$ also flow through the transistors $Q_1$ and $Q_5$ with the same current ratio due to the operation of the current mirror circuits, resistors can be provided in either the collector or the emitter circuits of the transistors $Q_1$ and $Q_5$ and the voltage thereacross used as an output.

Figure 2:
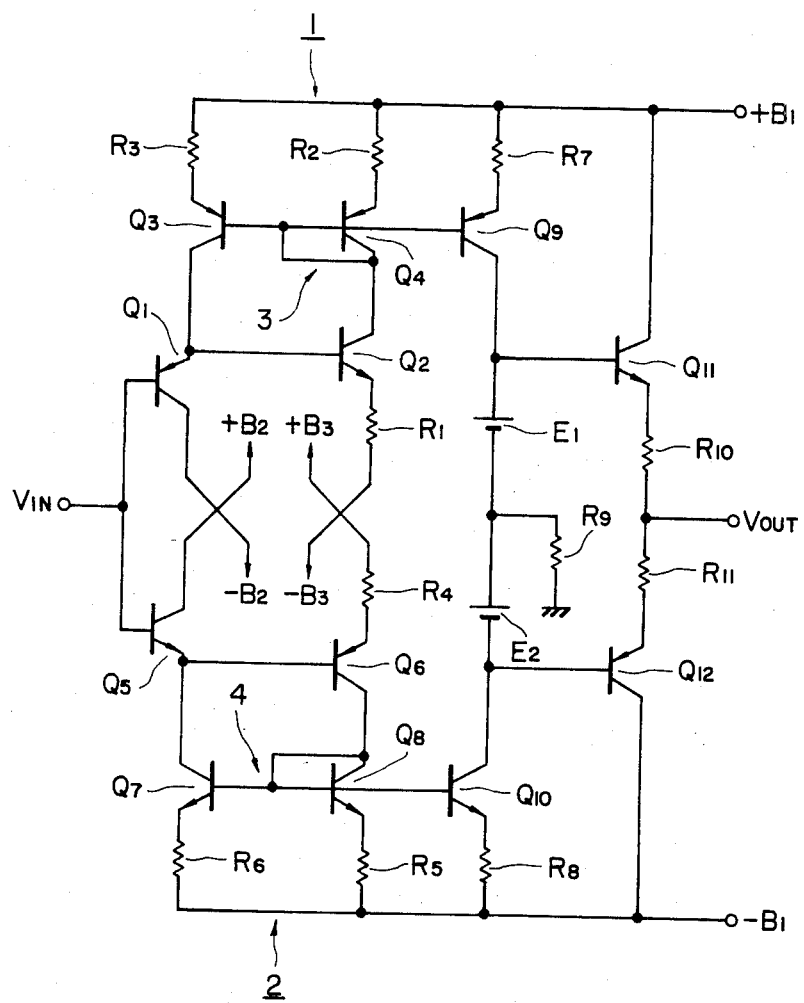
FIG. 2 is a circuit diagram showing a preferred embodiment of a push-pull amplifier circuit according to the invention.

Fig. 2 is a circuit diagram showing a preferred example of an amplifier circuit where the outputs from the amplifier stages 1 and 2 shown in FIG. 1 are combined to drive a load (not shown) in a push-pull manner. In FIG. 2, a PNP transistor $Q_9$ is connected in such a manner that the base of the transistor $Q_9$ is commonly coupled to the base of the transistor $Q_4$ in the current mirror circuit 3, the emitter of the transistor $Q_9$ is connected through a resistor $R_7$ to a positive voltage source $+B_1$ and the collector thereof is grounded via a reference biasing source $E_1$ and a resistor $R_9$.

An NPN transistor $Q_{10}$ is provided with the base of the transistor $Q_{10}$ commonly connected to the base of the transistor $Q_8$ in the current mirror circuit 4, the emitter thereof coupled through a resistor $R_8$ to a negative voltage source $-B_1$ and the collector thereof grounded via a reference biasing source $E_2$ and the resistor $R_9$. The collector outputs of the transistor $Q_9$ and $Q_{10}$ are employed as base driving signals of output push-pull driving transistors $Q_{11}$ and $Q_{12}$. The emitters of the NPN transistor $Q_{11}$ and the PNP transistor $Q_{12}$ are connected to one another through emitter resistors $R_{10}$ and $R_{11}$ to drive the load in a push-pull manner.

In this case, if the ratio of currents flowing through the transistors $Q_9$ and $Q_4$ is maintained at a constant value of $1/\alpha$, the conditions of equation (1) are also established, and further the voltage $V_B$ at a common base line of the current mirror circuit 3 can be expressed as follows:

$$V_B = +B_1 - V_{BE4} - I_2 R_2. \tag{9}$$

Rearranging equation (9) by substituting equation (1) thereinto:

$$V_B = +B_1 - V_{BE4} - \frac{R_2}{R_1}(V_{IN} + V_{BE1} - V_{BE2} + B_3), \tag{10}$$

Further, the current $I_3$ flowing from the transistor $Q_9$ to the resistor $R_9$ is represented as follows:

$$I_3 = (+B_1 - V_{BE9} - V_B)/R_7. \tag{11}$$

Therefore, the base voltage $V_1$ of the transistor $Q_{11}$ is:

$$V_1 = I_3 \cdot R_9 + E_1 = \frac{R_9}{R_7}(+B_1 - V_{BE9} - V_B) + E_1. \tag{12}$$

Substituting equation (10) into equation (12):

$$V_1 = \frac{R_9}{R_7}\left\{ V_{BE4} - V_{BE9} + \frac{R_2}{R_1}(V_{IN} + V_{BE1} - V_{BE2} + B_3) \right\} + E_1 \tag{13}$$

In equation (13), $(V_{BE1} - V_{BE2})$ is a constant $\gamma$ in view of equation (5) and $(V_{BE4} - V_{BE9})$ can be expressed as:

$$V_{BE4} - V_{BE9} \approx \frac{kT}{q}\ln(\beta'/\alpha'). \tag{14}$$

The above equation represents the $I_S$ ratio of the transistors $Q_9$ and $Q_4$. Since this expression can also regarded as constant $\gamma'$, equation (13) is as follows:

$$V_1 = \frac{R_9}{R_7}\left( \gamma' + \frac{R_2}{R_1}(V_{IN} + \gamma + B_3) \right) + E_1. \tag{15}$$

With regard to the base voltage $V_2$ of the transistor $Q_{12}$ in the second amplifier stage 2, the following equation is similarly established:

$$V_2 = \frac{R_9}{R_8}\left( \gamma' + \frac{R_5}{R_4}(V_{IN} + \gamma + B_3) \right) + E_2. \tag{16}$$

If the biasing voltage $E_1$ is set equal to the sum of the base-emitter voltage $V_{BE11}$ of the transistor $Q_{11}$ and the voltage across the resistor $R_{10}$ and the biasing voltage $E_2$ set equal to the sum of the base-emitter voltage $V_{BE12}$ of the transistor $Q_{12}$ and the voltage across the resistor $R_{11}$, $E_1$ in equation (15) and $E_2$ in equation (16) can be eliminated to thereby obtain the push-pull output voltage signal $V_{OUT}$. As is clear from the above description, this output voltage signal $V_{OUT}$ is independent of the base-emitter voltage $V_{BE}$ of the amplification transistor thereby resulting in a significant decrease in distortion.

In this case, if the resistance values of the resistors $R_1$, $R_2$, $R_4$, $R_5$, $R_7$ and $R_8$ are selected such that $R_1 = R_4$, $R_2 = R_5$ and $R_7 = R_8$, as is clear from equations (15) and (16), the overall circuit gain is twice the gain of an ordinary single amplifier. In addition to this, the offset voltage in the output voltage signal $V_{OUT}$ is also zero as is desired.

Figure 3:
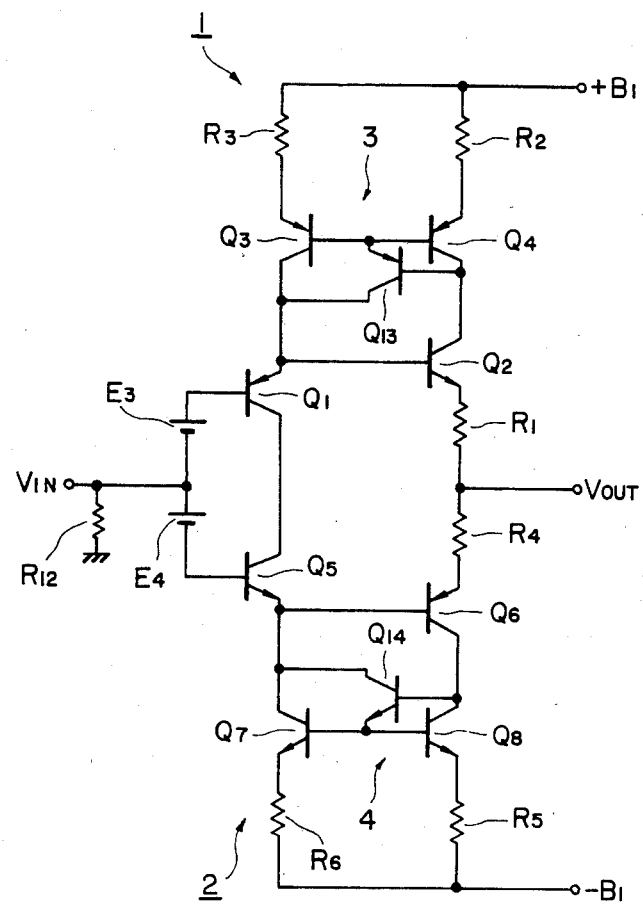
FIG. 3 is a circuit diagram showing another embodiment of a push-pull amplifier circuit of the invention.

FIG. 3 is a circuit diagram showing another embodiment of an amplifier circuit of the present invention in which circuit components that are common to those shown in FIG. 1 bear the same reference numerals. In this example, base biasing sources $E_3$ and $E_4$ connected to the bases of the transistors $Q_1$ and $Q_5$ in the input stage, respectively, and further an input resistor $R_{12}$ is provided. The collectors of the transistors $Q_1$ and $Q_5$ are commonly connected and the emitter resistors $R_1$ and $R_4$ of the output transistors $Q_2$ and $Q_6$ are also commonly connected, the common connection point being used as an output terminal. Compared with the embodiment shown in FIG. 2, the number of voltage sources is decreased but the offset voltage in the output voltage signal $V_{OUT}$ is nonetheless reduced to zero. It should be noted that a PNP transistor $Q_{13}$ and an NPN transistor $Q_{14}$ that are additionally provided in the current mirror circuits 3 and 4, respectively, to improve the accuracy in the current mirror outputs whereby the ratio of currents supplied to the transistors $Q_1$ and $Q_2$ and the ratio of currents supplied to the transistors $Q_7$ and $Q_8$ are more effectively made constant to completely eliminate any distortion in the base-emitter voltages $V_{BE}$ of the respective transistors.

In the above-described embodiments of amplifier circuits constructed according to the invention, with the gain at unity because the transistors in the respective stages are connected in an emitter-follower configuration, since the amplifier circuit is formed as class B push-pull amplifier, non-linearities in the output signal caused by non-linearities in the base-emitter voltages $V_{BE}$ can be completely eliminated thereby resulting in the elimination of crossover distortion.

Next, an amplifier circuit in which variations in the DC output potential level at the output terminal of the amplifier circuit is detected and fed back as a DC level to the input side of the amplifier thereby resulting in an improvement in the stability of the circuit at very low frequencies will be described.

Figure 4:
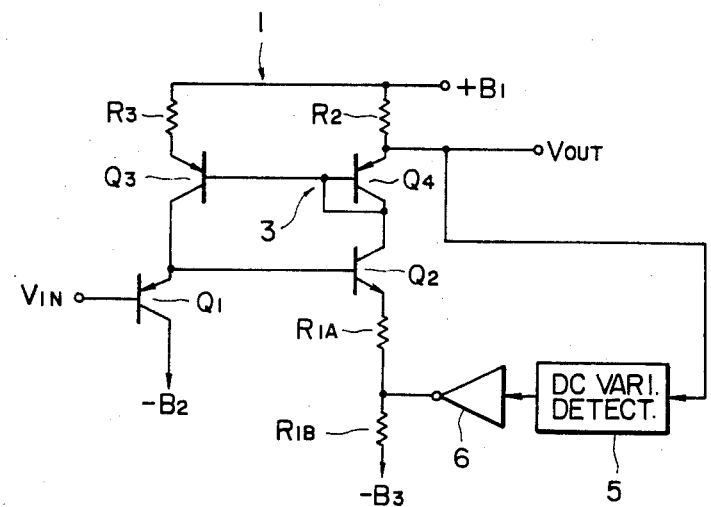
FIG. 4 is a circuit diagram for describing an operating principle of an amplifier circuit in which DC feedback is employed.

FIG. 4 is a circuit diagram for describing the operating principle of an amplifier circuit in which DC feedback is employed. In this figure, the same circuit elements as those shown in FIGS. 1 to 3 are designated by the same reference numerals or characters. A DC level variation detecting circuit 5 which operates to detect DC level variations at the output terminal of the amplifier circuit is constituted by a DC servo circuit together with an inverter 6. The inverter 6 operates to invert the polarity of a signal corresponding to the output variations and then applies (feeds back) the inverted signal through an emitter resistor $R_{1A}$ to the emitter of the transistor $Q_2$.

In this circuit, with $R_1 = R_{1A} + R_{1B}$ as in the case of the circuits shown in FIGS. 1 to 3, the conditions of equations (1) to (6) are established. Therefore, the output $V_{OUT}$ is expressed as follows:

$$V_{OUT} = I_2 R_2 = \frac{R_2}{R_1}(V_{IN} + B_3 + \gamma) \quad (7')$$

As is clear from equation (7'), the gain of the circuit is defined by $R_2/R_1$ and the output $V_{OUT}$ is completely independent of the base-emitter voltage $V_{BE}$ of the amplifying transistor. Consequently, suppression of distortion is accomplished.

When the DC potential level increases, the DC level variation detecting circuit 5 detects such fact and in response generates a DC voltage signal proportional thereto. The DC voltage signal is applied to the inverter 6 where its polarity is inverted. Then, the thus obtained servo voltage signal is applied to the emitter of the transistor $Q_2$. As a result, the emitter voltage decreases and thus the current flowing through the transistor $Q_2$ is increased whereby the voltage drop across the resistor $R_2$ is also increased. Accordingly, the DC level at the output terminal is reduced. DC servo control is attained in the above described manner.

A low-frequency range filter such as a smoothing circuit is employed as the DC level variation detecting circuit 5. Accordingly, not only DC components but also level variations in very low frequency components can be detected. Therefore, for such low frequencies, negative feedback is effected to thereby improve the stability of circuit. According to this system, since the emitter voltage of the transistor $Q_2$, that is, the voltage appearing at the voltage source line is varied as a function of DC servo control, this operations has no effect on the signal line. Thus, interference with respect to the signal system does not occur resulting in a more stable DC servo control. In addition, with a circuit having an extremely simple construction, the above objects of the invention are accomplished.

It should be noted that an output can be obtained in various manners. For example, the voltage appearing across a resistor connected between the collector of the transistor $Q_2$ and the current source 3 may be used as an output. Further, since the ratio of currents flowing through the transistors $Q_1$ and $Q_2$ is constant, variations in current flowing through the transistor $Q_1$ may be taken as an output in a similar manner.

Figure 5:
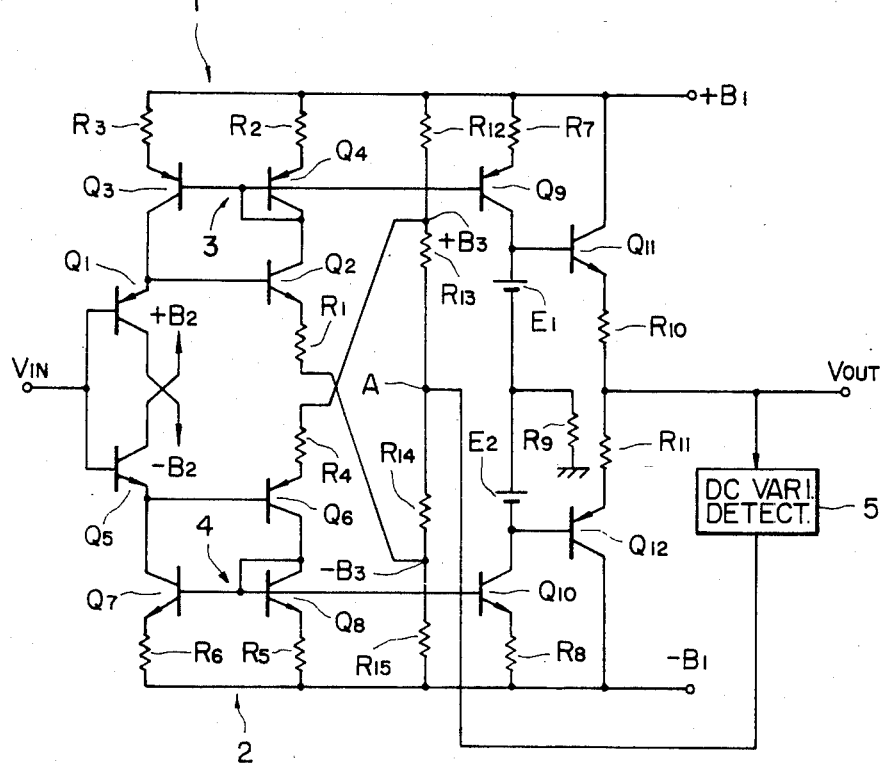
FIG. 5 is a circuit diagram showing a preferred embodiment of a push-pull amplifier having a DC servo control circuit according to the invention.

FIG. 5 is a circuit diagram showing a preferred embodiment of a push-pull amplifier having the above-described servo control circuit. In FIG. 5, the same circuit elements as those shown in FIG. 2 are designated by the same reference numerals and characters. The output of the DC level variation detecting circuit 5 is fed back to the emitters of the transistors $Q_2$ and $Q_6$. The emitter resistors $R_1$ and $R_4$ of the transistors $Q_2$ and $Q_6$ are connected at a point between voltage dividing resistors $R_{12}$ and $R_{13}$ and a point between voltage dividing resistors $R_{14}$ and $R_{15}$, respectively, the resistors constituting a voltage dividing circuit of the power source $+B_1$ and $-B_1$. The DC servo voltage is applied to a neutral point A of the voltage dividing circuit.

In this circuit, the conditions of equations (9) to (16) are also established. Therefore, the same effect as that of the circuit shown in FIG. 2 is obtained. Furthermore, due to the DC servo circuit, when a DC level variation occurs at the output terminal, a positive servo voltage proportional to the variation is generated by the detecting circuit 5 and applied to the emitters of the transistors $Q_2$ and $Q_6$. As a result, the currents flowing through the transistors $Q_2$ and $Q_6$ increase whereby the currents flowing through the transistors $Q_9$ and $Q_{10}$ are also increased. Consequently, the base voltages of the output transistors $Q_{11}$ and $Q_{12}$ are decreased to thereby reduce the DC level at the output terminal.

As described above, according to this invention, suppression of distortion caused by the base-emitter voltage $V_{BE}$ and elimination of distortion caused by even numbered higher harmonics is accomplished. Therefore, suppression of distortion in the output signal is remarkable compared with an ordinary push-pull amplifier. Furthermore, due to the use of DC servo control, the stability of the amplifier circuit in very low frequency ranges is remarkably improved.

While in the above described embodiments, current mirror circuits are employed to supply current to the respective transistors, other circuits capable of performing the same function to that of the current mirror circuit may be employed if desired.

What is claimed is:
1. A push-pull amplifier circuit, comprising:
   first amplifying means including a first transistor having a base to which an input signal is applied, a second transistor having a base to which an output of said first transistor is applied, said second transistor being opposite in conductivity type to said first transistor, and means for supplying currents to said first and second transistors, the ratio of said currents being constant; and second amplifying means including a third transistor having a base to which said input signal is applied, a fourth transistor having a base to which an output of said third transistor is applied, said fourth transistor being opposite in conductivity type to said third transistor, and means for supplying currents to said third and fourth transistors, respectively, the ratio of said currents being constant;

a load coupled to be driven by the current flowing through said first and third transistors or the current flowing through said second and fourth transistors.

2. The push-pull amplifier circuit as defined in claim 1 wherein said first and third transistors are connected in emitter follower configurations, emitter follower outputs thereof being applied to the bases of said second and fourth transistors.

3. The push-pull amplifier circuit as defined in claim 1 wherein said first transistor is opposite in conductivity type to said third transistor.

4. The push-pull amplifier circuit as defined in either of claims 1 or 3 wherein said push-pull amplifier circuit further comprises:

means for providing an output corresponding to the current flowing through one of said first and said second transistors and corresponding to the current flowing through one of said third and said fourth transistors to drive said load; and means for detecting variations in the output of said output providing means to provide a feedback voltage corresponding to said variations to a predetermined circuit point.

5. The push-pull amplifier circuit as defined in claim 4 wherein the output of said detecting means is fed back to the emitters of said second and fourth transistors.

6. The push-pull amplifier circuit as defined in claim 5 wherein said first and third transistors are connected in emitter follower configurations, the emitter follower outputs thereof being applied to the bases of said second and fourth transistors, respectively.

7. An amplifier circuit comprising: a first PNP transistor, an input signal being coupled to the base of said first PNP transistor; a second NPN transistor, the base of said NPN transistor being coupled to the emitter of said first PNP transistor; a third PNP transistor, the collector of said third PNP transistor being coupled to said emitter of said first PNP transistor; a fourth PNP transistor, the base and collector of said fourth PNP transistor being coupled to the base of said third PNP transistor and to the collector of said second NPN transistor; a fifth NPN transistor, the base of said fifth NPN transistor being coupled to said input signal; a sixth PNP transistor, the base of said sixth PNP transistor being coupled to the emitter of said fifth NPN transistor; a seventh NPN transistor, the collector of said seventh NPN transistor being coupled to said emitter of said fifth transistor and said base of said sixth transistor; an eighth NPN transistor, the base and collector of said eighth NPN transistor being coupled to the base of said seventh NPN transistor and to the collector of said sixth PNP transistor; first, second, and third positive voltage sources and first, second, and third negative voltage sources; a first resistor coupled between the emitter of said NPN transistor and said third negative voltage source; a second resistor coupled between the emitter of said fourth PNP transistor and said first positive voltage source; a third resistor coupled between the emitter of said third PNP transistor and said first positive voltage source; a fourth resistor coupled between the emitter of said sixth PNP transistor and said third positive voltage source; a fifth resistor coupled between the emitter of said eighth NPN transistor and said first negative voltage source; and a sixth resistor coupled between the emitter of said seventh NPN transistor and said first negative voltage source; the collector of said fifth NPN transistor being coupled to said second positive voltage source and the collector of said first PNP transistor being coupled to said second negative voltage source.

8. The amplifier circuit of claim 7 further comprising: a ninth PNP transistor, the base of said ninth PNP transistor being coupled to the base of said fourth PNP transistor; a tenth NPN transistor, the base of said tenth NPN transistor being coupled to said base of said eighth NPN transistor; an eleventh NPN transistor, the base of said eleventh NPN transistor being coupled to the collector of said ninth PNP transistor; a twelfth PNP transistor, the base of said twelfth PNP transistor being coupled to the collector of said tenth NPN transistor, the collector of said eleventh NPN transistor being coupled to said first positive voltage source and the collector of said twelfth PNP transistor being coupled to said first negative voltage source; a first bias voltage source having a positive terminal coupled to said base of said eleventh NPN transistor; a second bias voltage source having a positive terminal coupled to the negative terminal of said first bias voltage source and a negative terminal coupled to said base of said twelfth PNP transistor; a seventh resistor having a first terminal coupled to the junction between said first and second bias voltage sources and a second terminal coupled to ground; an eighth resistor coupled between the emitter of said eleventh NPN transistor and an output terminal; and a ninth resistor coupled between the emitter of said twelfth PNP transistor and said output terminal.

9. The amplifier of claim 8, wherein said third positive voltage source and said third negative voltage source comprise tenth through thirteenth resistors coupled in series between said first positive voltage source and said first negative voltage source with said tenth resistor having a first terminal coupled to said first positive voltage source, a second terminal coupled to a first terminal of said eleventh resistor, said eleventh resistor having a second terminal coupled to a first terminal of said twelfth resistor, said twelfth resistor having a second terminal coupled to a first terminal of said thirteenth resistor and said thirteenth resistor having a second terminal coupled to said first negative voltage source, said first resistor being coupled between said emitter of said second NPN transistor and the junction between said twelfth and thirteenth resistors and said fourth resistor being coupled between said emitter of said sixth the PNP transistor and the junction between said tenth and eleventh resistors; and means for producing a signal representing variations in the DC level of the voltage on said output terminal, said signal being coupled to the junction between said eleventh and said twelfth resistors.

10. An amplifier circuit comprising: a first PNP transistor; a first bias voltage source having a positive terminal coupled to the base of said first PNP transistor and a negative terminal coupled to an input terminal; a second NPN transistor, the base of said second NPN transistor being coupled to the emitter of said first PNP transistor; a third PNP transistor, the collector of said third PNP transistor being coupled to said emitter of said first PNP transistor; a fourth PNP transistor, the base of said fourth PNP transistor being coupled to the base of said third PNP transistor, and the collector of said fourth PNP transistor being coupled to the collector of said second NPN transistor; a fifth NPN transistor, the collector of said fifth NPN transistor being coupled to the collector of said first PNP transistor; a second bias voltage source having a negative terminal coupled to the base of said fifth NPN transistor and a positive terminal coupled to said input terminal; a sixth PNP transistor, the base of said sixth PNP transistor being coupled to the emitter of said fifth NPN transistor; a seventh NPN transistor, the collector of said seventh NPN transistor being coupled to said emitter of said fifth NPN transistor and said base of said sixth PNP transistor; an eighth NPN transistor, the base of said eighth NPN transistor being coupled to the base of said seventh NPN transistor; a ninth PNP transistor, the base of said ninth PNP transistor being coupled to the collector of said fourth PNP transistor, the emitter of said ninth PNP transistor being coupled to the base of said fourth PNP transistor, and the collector of said ninth PNP transistor being coupled to said collector of said third PNP transistor; a tenth NPN transistor, the base of said tenth NPN transistor being coupled to said collector of said eighth NPN transistor, the collector of said tenth NPN transistor being coupled to said collector of said seventh NPN transistor, and the emitter of said tenth NPN transistor being coupled to said base of said eighth NPN transistor; a first resistor coupled between the emitter of said second NPN transistor and an output terminal; a second resistor coupled between the emitter of said fourth PNP transistor and a positive voltage source; a third resistor coupled between the emitter of said third PNP transistor and said positive voltage source; a fourth resistor coupled between the emitter of said sixth PNP transistor and said output terminal; a fifth resistor coupled between the emitter of said eighth NPN transistor and a negative voltage source; and a sixth resistor coupled between the emitter of said seventh NPN transistor and said negative voltage source.

\* \* \* \* \*